United States Patent
Kum

(10) Patent No.: US 7,964,498 B2
(45) Date of Patent: Jun. 21, 2011

(54) PHASE-CHANGE MEMORY DEVICE CAPABLE OF IMPROVING CONTACT RESISTANCE AND RESET CURRENT AND METHOD OF MANUFACTURING THE SAME

(75) Inventor: Kyong-Soo Kum, Ichon (KR)

(73) Assignee: Hynix Semiconductor Inc. (KR)

( * ) Notice: Subject to any disclaimer, the term of this patent is extended or adjusted under 35 U.S.C. 154(b) by 372 days.

(21) Appl. No.: 12/169,501

(22) Filed: Jul. 8, 2008

(65) Prior Publication Data

US 2009/0166602 A1 Jul. 2, 2009

(30) Foreign Application Priority Data

Dec. 26, 2007 (KR) .................. 10-2007-0137553

(51) Int. Cl.
*H01L 21/44* (2006.01)
(52) U.S. Cl. ..... 438/652; 438/102; 257/4; 257/E45.002; 257/E21.663
(58) Field of Classification Search ....... 257/4, E21.663, 257/2, 3, E45.002; 438/653, 652, 102
See application file for complete search history.

(56) References Cited

U.S. PATENT DOCUMENTS

| 2007/0210348 A1* | 9/2007 | Song et al. ............ 257/246 |
| 2008/0003815 A1* | 1/2008 | Lee et al. ............. 438/653 |

FOREIGN PATENT DOCUMENTS

| KR | 1020060082510 | 7/2006 |
| KR | 100655082 B1 | 12/2006 |
| KR | 1020060124290 | 12/2006 |
| KR | 1020080035212 | 4/2008 |

* cited by examiner

*Primary Examiner* — Thomas L Dickey
*Assistant Examiner* — Fazli Erdem
(74) *Attorney, Agent, or Firm* — Baker & McKenzie LLP

(57) ABSTRACT

A phase-change memory device and a method of manufacturing the same, wherein the phase-change memory device includes a semiconductor substrate having a switching device, a phase-change layer formed on the semiconductor substrate having the switching device to change a phase thereof as the switching device is driven, and a bottom electrode contact in contact with the switching device through a first contact area and in contact with the phase-change layer through a second contact area, which is smaller than the first contact area.

11 Claims, 4 Drawing Sheets

PHASE-CHANGE MEMORY DEVICE CAPABLE OF IMPROVING CONTACT RESISTANCE AND RESET CURRENT AND METHOD OF MANUFACTURING THE SAME

CROSS-REFERENCES TO RELATED APPLICATION

The present application claims priority under 35 U.S.C. 119(a) to Korean application number 10-2007-0137553, filed in the Korean Intellectual Property Office on Dec. 26, 2007, which is incorporated by reference in its entirety as if set forth in full.

BACKGROUND

1. Technical Field

The embodiments described herein relate to a semiconductor integrated circuit, and more particularly, to a phase-change memory device having a bottom electrode contact and a method of manufacturing the same.

2. Related Art

Today's portable information communication systems are capable of processing large-scale information through a wireless scheme. Such systems require memory devices having high-speed and mass-storage capabilities. Such a memory device must have a non-volatile function of a normal flash memory device, high-speed performance of an SRAM (static random access memory), and a high-integration function of a DRAM (dynamic RAM) while reducing power consumption thereof. An FRAM (ferroelectric RAM), an MRAM (magnetic RAM), a PRAM (phase-change RAM), and an NFGM (nano floating gate memory), which represent superior characteristics in terms of power consumption, data retention and write/read performance as compared with the normal memory device, have been proposed to meet these needs.

Among other things, a PRAM has a simple structure and can be fabricated at a low cost. In addition, the PRAM can be operated at a high-speed, which makes PRAM technology a potentially good option for meeting the needs of today's, and tomorrow's portable systems.

A conventional PRAM has a phase change layer, in which a crystal phase of the phase change layer is changed according to heat generated from a current applied thereto. A chalcogenide compound (Ge—Sb—Te; GST) composed of germanium (Ge), antimony (Sb), and tellurium (Te) is often used as a phase change layer for the PRAM. The phase of the phase change layer, such as a GST, may be changed based on heat generated in the phase change layer due to current flowing through the phase change layer.

A GST, for example, has high resistivity when it is in an amorphous state and a low resistivity when it is in a crystal state. Therefore, the states of the GST can be used to indicate different logic values, and thus the GST can be used as a data storage medium of a memory device.

A phase change memory device should have low power consumption and high integration characteristics, so various attempts have been made to reduce the operational current of conventional GST, i.e., to reduce the reset current of the GST.

A method of reducing a contact area between a GST layer and a bottom electrode contact is extensively used to reduce the reset current. In order to reduce the contact area between the GST layer and the bottom electrode contact, the bottom electrode contact is fabricated through a lithography process such that the bottom electrode contact has a minimum diameter. However, although the reset current can be improved due to reduction of the contact area between the bottom electrode contact and the GST layer, a contact area between the bottom electrode contact and a switching device, which is provided at a lower portion of the bottom electrode contact, will also be reduced. For this reason, contact resistance between the bottom electrode contact and the switching device may increase, so that on current is lowered.

SUMMARY

A phase-change memory device having a bottom electrode contact capable of reducing contact resistance between the bottom electrode contact and a switching device while reducing reset current of a phase change layer is described herein. A method of manufacturing a phase-change memory device having such a bottom electrode contact is also described.

According to one aspect, a phase-change memory device includes a semiconductor substrate having a switching device, a phase-change layer formed on the semiconductor substrate having the switching device to change a phase thereof as the switching device is driven, and a bottom electrode contact in contact with the switching device through a first contact area and in contact with the phase-change layer through a second contact area, which is smaller than the first contact area.

According to another aspect, a phase-change memory device includes a semiconductor substrate, a switching device formed on the semiconductor substrate, a bottom electrode contact in contact with the switching device through a first contact area, an interlayer dielectric layer interposed between bottom electrode contacts to insulate the bottom electrode contacts from each other, a phase-change layer formed on the interlayer dielectric layer to make contact with the bottom electrode contact through a second contact area, which is smaller than the first contact area, wherein the bottom electrode contact has a bulb-type sidewall.

According to still another aspect, a method of manufacturing the phase-change memory device is provided. First, a semiconductor substrate having a switching device is prepared. Then, an interlayer dielectric layer is formed on the semiconductor substrate. After that, a bottom electrode contact hole is formed in the interlayer dielectric layer. At this time, a lower portion of the bottom electrode contact has a diameter larger than a diameter of an upper portion of the bottom electrode contact through which an upper portion of the switching device is exposed. Then, a bottom electrode contact is formed in the bottom electrode contact hole. After that, the phase-change layer is formed on the interlayer dielectric layer having the bottom electrode contact.

These and other features, aspects, and embodiments are described below in the section entitled "Detailed Description."

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

Figure 1:
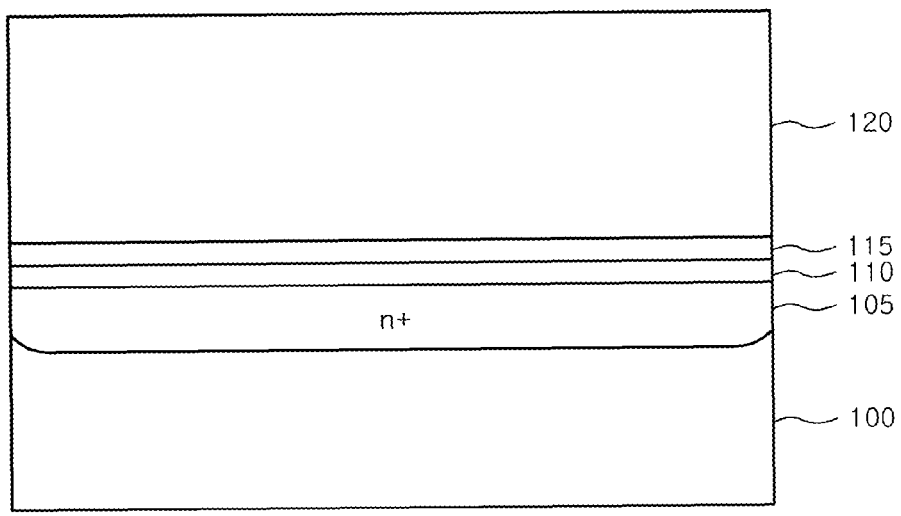
FIGS. 1 to 6 are sectional views showing a method of manufacturing a phase-change memory device having a bottom electrode contact according to an embodiment.

FIGS. 1-6 are sectional views showing a method of manufacturing a phase-change memory device having a bottom electrode contact according to an embodiment. Referring to FIG. 1, a high doped n-type impurity area 105 is formed in a semiconductor substrate 100. A pad oxide layer 110 and a pad nitride layer 115, which can serve as substrate protective layers, can then be sequentially formed on the semiconductor substrate 100.

A first interlayer dielectric layer 120 having a predetermined thickness can then be formed on the pad nitride layer 115. The first interlayer dielectric layer 120, for example, can include an HDP (high density plasma) oxide layer possessing superior interlayer planarization characteristics. The HDP oxide layer can have a thickness corresponding to a height of a diode included in the phase charge memory device and which will be described later.

Figure 2:
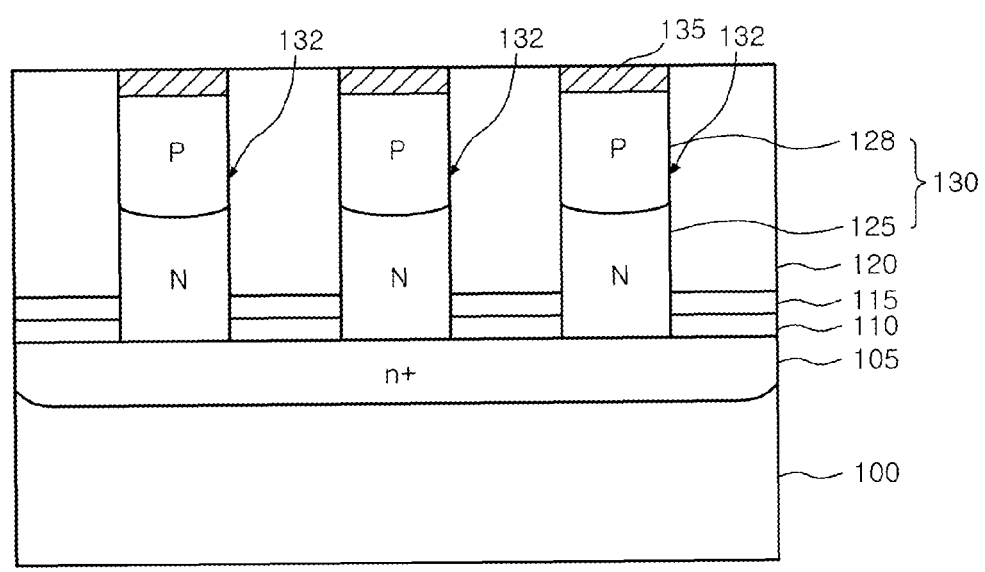

Referring to FIG. 2, predetermined portions of the first interlayer dielectric layer 120, the pad nitride layer 115 and the pad oxide layer 110 as defined using photolithography techniques can then be etched until the high doped n-type impurity area 105 is exposed, thereby forming one or more contact hole 132 in which the diode(s) can then be formed.

An n-type SEG (selective epitaxial growth) layer 125 can then be grown on substrate 100 such that the contact hole is sufficiently filled up with the n-type SEG layer 125. Excess portions of the SEG layer 125 above the top of layer 120 can then be removed using conventional techniques. P-type impurities can then be implanted in the n-type SEG layer 125, thereby forming a p-type impurity area 128 on an upper portion of the n-type SEG layer 125. Thus, a PN diode 130 serving as a switching device can be formed in the contact hole by the n-type layer 125 and the p-type impurity area 128.

An ohmic contact layer 135 can then be selectively formed on the PN diodes 130, that is, on the p-type impurity area 128. The ohmic contact layer 135 can, for example, include a metal silicide layer.

Figure 3:
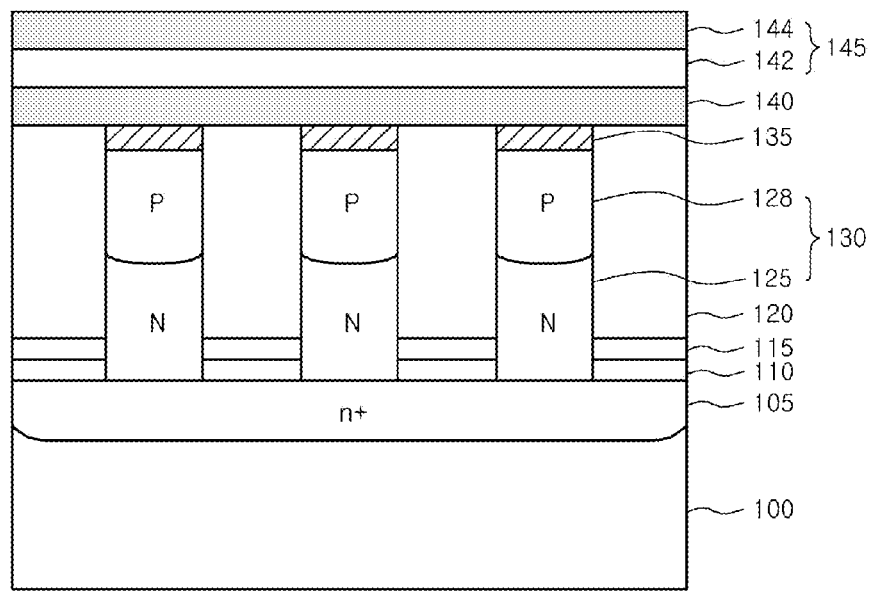

Referring to FIG. 3, a second interlayer dielectric layer 140 and a buffer layer 145 can then be sequentially formed on the first interlayer dielectric layer 120. The second interlayer dielectric layer 140 can be provided to provide insulation between bottom electrode contacts that will be formed later. The second interlayer dielectric layer 140 can include a silicon nitride layer having a superior heat-resistant characteristic.

The buffer layer 145 is provided to deform the shape of the bottom electrode contact and includes a first material layer 142 and a second material layer 144. The first material layer 142, for example, can include a silicon oxide layer or a tungsten layer having etching selectivity relative to the second interlayer dielectric layer 140. The second material layer 144 can be a hard mask layer, which protects the first material layer 142 while preventing scattered reflection from occurring on the second material layer 144. For instance, the second material layer 144 can include a silicon nitride layer.

Figure 4:
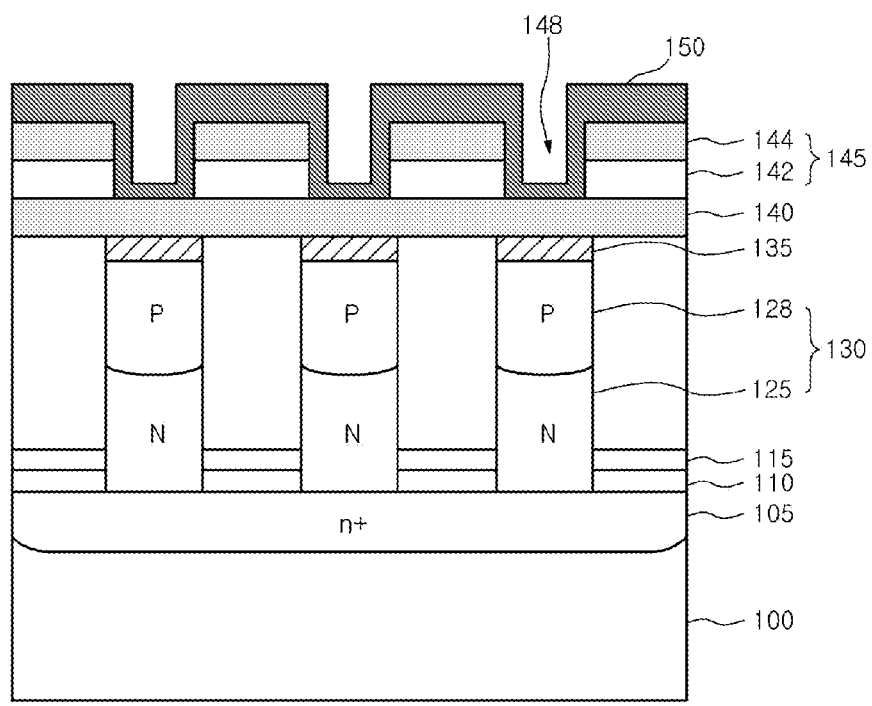

Referring to FIG. 4, after forming a mask pattern (not shown) on the buffer layer 145 through, e.g., a conventional photolithography process, a predetermined portion of the buffer layer 145 is etched, thereby forming preliminary holes 148 in the buffer layer 145 over the upper portions of the diodes 130. The preliminary holes 148 can have a minimum diameter obtainable by using existing exposure equipment. In order to form the preliminary holes 148 in the buffer layer 145, the etching process can, e.g., be performed at a pressure of 10 to 30 mTorr, at a source power of 1000 to 2000 W, and at a bias power of 500 to 1000 W while providing $CH_2F_2$ gas, $CHF_4$ gas, $O_2$ gas, and Ar gas at flow rates of 5 to 15 sccm, 50 to 70 sccm, 5 to 15 sccm and 50 to 100 sccm, respectively.

Then, a blocking layer 150 can be formed on the buffer layer 145 having the preliminary holes 148. The blocking layer 150 can, e.g., include a silicon oxide layer having etching selectivity relative to the second interlayer dielectric layer 140. At this time, even if the blocking layer 150 has a uniform thickness, the blocking layer 150 formed on the buffer layer 145 may be thicker than the blocking layer 150 formed on the sidewalls and bottom wall of the preliminary holes 148.

Figure 5:
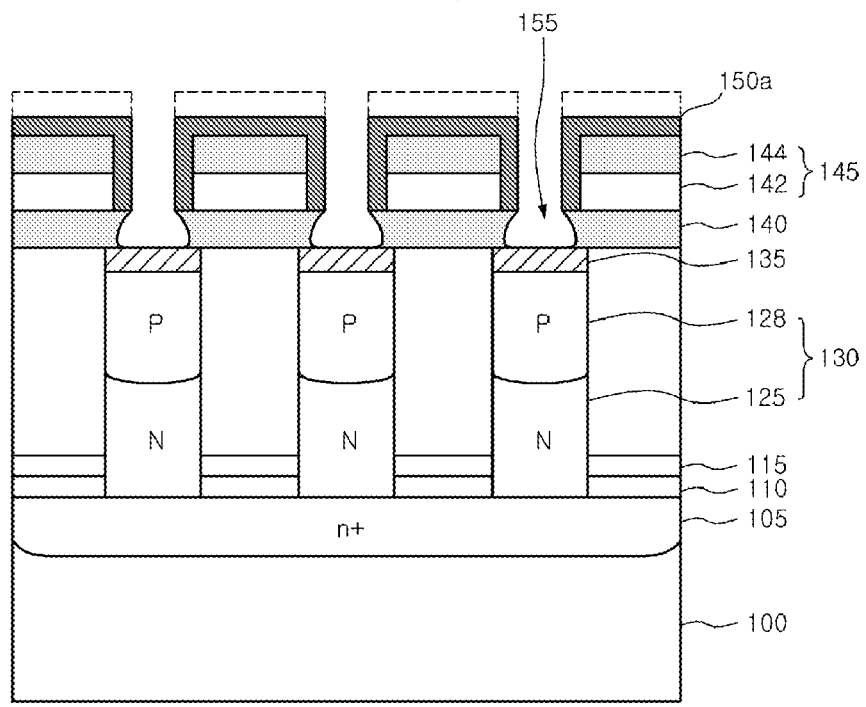

As shown in FIG. 5, the blocking layer 150 can be patterned and etched via an anisotropic etching process until the second interlayer dielectric layer 140 formed on the bottom wall of the preliminary hole 145 is exposed. Therefore, the portions of blocking layer 150 formed on the bottom wall of the preliminary hole 148 and the top surface of the buffer layer 145 can be selectively etched, while the portions of blocking layer 150 formed on the sidewalls of the preliminary hole 148 are un-etched.

The above etching process can be continuously performed until the second interlayer dielectric layer 140 is exposed, so that the second interlayer dielectric layer 140 can serve as an etching end point. Since the portion of blocking layer 150 formed on the buffer layer 145 can have a thickness that is thicker than that of the portion of blocking layer 150 formed on the bottom wall of the preliminary hole 148 (that is, the upper portion of the second interlayer dielectric layer 140), a portion 150a of blocking layer 150 can still remain on the buffer layer 145 even when the portion of blocking layer 150 formed on the bottom wall of the preliminary hole 148 has been completely removed.

Next, the second interlayer dielectric layer 140, which is exposed through the above process, can be isotropically etched by using the remaining portions of blocking layer 150 as an etching mask. The isotropic etching process can be performed at a pressure of 40 to 60 mTorr, at a source power of 500 to 1500 W, and at a bias power of 100 to 300 W while providing $C_4F_6$ gas, $CHF_3$ gas, $O_2$ gas, and Ar gas at flow rates of 10 to 30 sccm, 10 to 30 sccm, 5 to 20 sccm and 300 to 500 sccm, respectively. In addition, the second interlayer dielectric layer 140 can be processed through a wet etching process using a nitric acid solution by taking the thickness of the second interlayer dielectric layer 140 into consideration.

A bottom electrode contact hole 155 can then be formed in the second interlayer dielectric layer 140 via the isotropically etching of the second interlayer dielectric layer 140. A diameter of an upper portion of the bottom electrode contact hole 155 can be smaller than a diameter of a lower portion of the bottom electrode contact hole 155, such that the bottom electrode contact hole 155 has a bulb-type sidewall. The upper portion of the bulb-type bottom electrode contact hole 155 can have a diameter smaller than the diameter of the preliminary hole 148, and the lower portion of the bulb-type bottom electrode contact hole 155 can have a diameter larger than the diameter of the preliminary hole 148 due to the above isotropic etching process. In other words, the upper portion of the bottom electrode contact hole 155 can have a diameter less than an exposure limit value.

Figure 6:
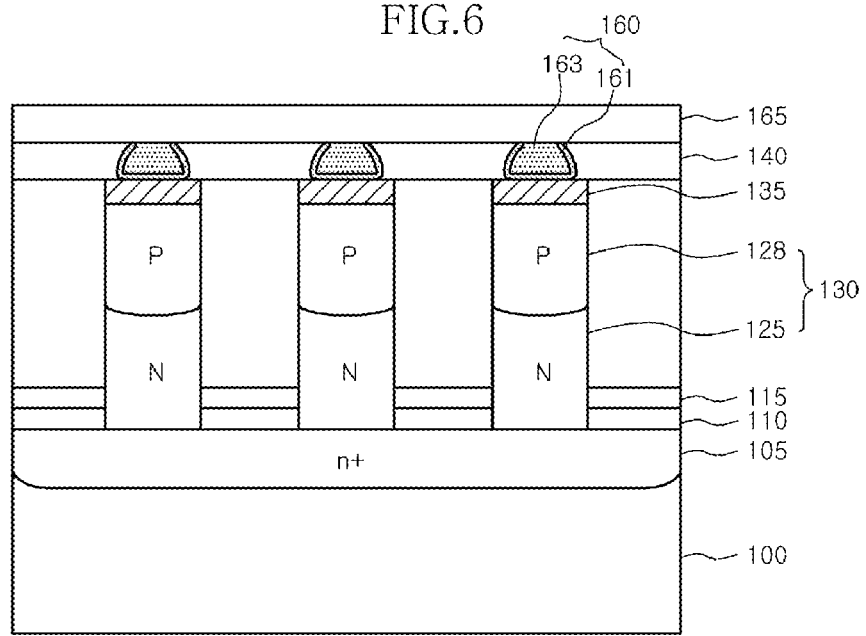

Then, as shown in FIG. 6, the blocking layer 150 can be removed. For example, if the blocking layer 150 includes the silicon oxide layer, then the blocking layer 150 can be removed by dipping the resultant semiconductor substrate in an HF solution. After that, the buffer layer 145 can be removed. For instance, the buffer layer 145 can be removed through a chemical mechanical polishing process.

Thereafter, conductive material can be filled in the bulb-type bottom electrode contact hole 155, thereby forming a bottom electrode contact 160. The bottom electrode contact 160 can include a barrier metal layer 161 formed on the surface of the bottom electrode contact hole 155, and a conductive layer 163 formed on the barrier metal layer 161. The barrier metal layer 161 can include a Ti/Ti N layer, and the conductive layer 153 can include a tungsten metal layer, a titanium metal layer, a polysilicon layer or a SiGe layer.

A phase-change layer, e.g., a GST layer 165 can then be formed on the second interlayer dielectric layer 140.

Figure 7:
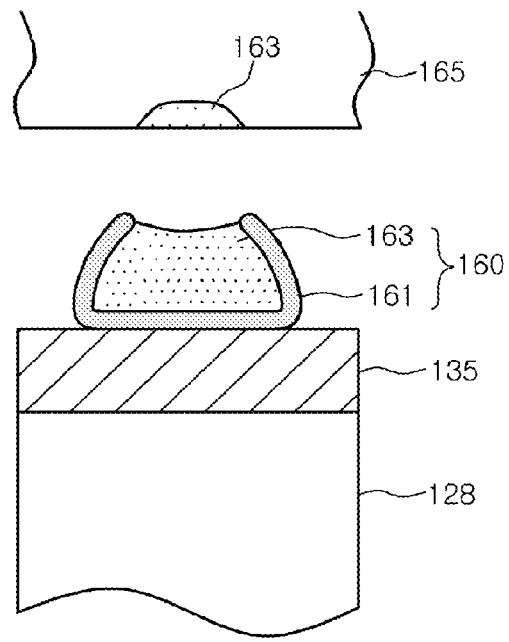
FIG. 7 is a sectional view showing a contact profile of a bulb-type bottom electrode contact relative to a diode and a phase-change layer.

FIG. 7 is an enlarged sectional view showing the GST layer 165 and the bulb-type bottom electrode contact 160. As shown in FIG. 7, since the lower portion of the bottom electrode contact 160 has a diameter larger than the diameter of the upper portion of the bottom electrode contact 160, the contact area between the bottom electrode contact 160 and the diode 130, which is the switching device, can be increased. Accordingly, the contact resistance can be reduced, so that an on current can be improved. In addition, since the upper portion of the bottom electrode contact 160 has a diameter smaller than the diameter of the lower portion of the bottom electrode contact 160, the contact area between the bottom electrode contact 160 and the phase-change layer 165 can be relatively small, so that the reset current can be reduced.

Figure 8:
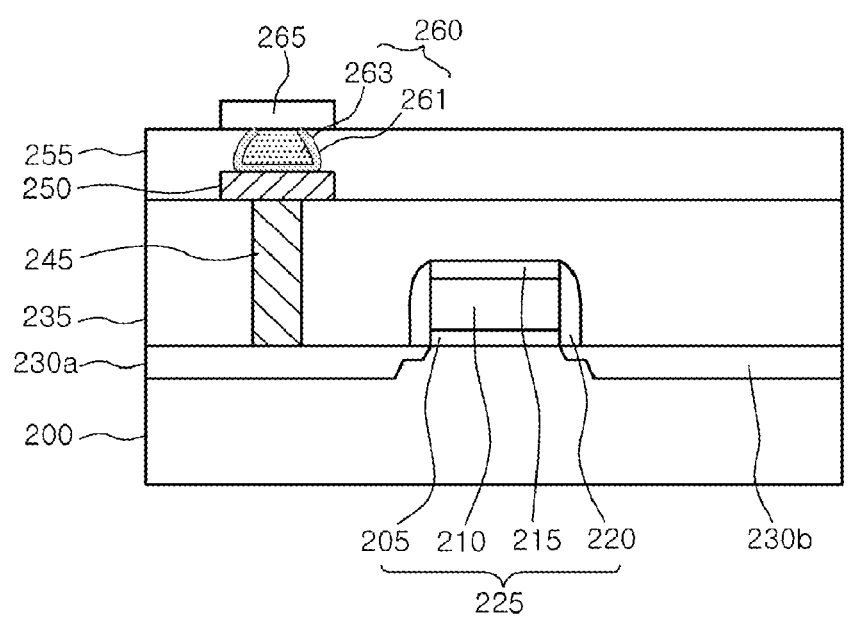
FIG. 8 is a sectional view showing a phase-change memory device having a bottom electrode contact according to another embodiment.

In other embodiments, as shown in FIG. 8, a MOS transistor can be used as the switching device. As generally known in the art, a MOS transistor includes a gate electrode structure 225 having a gate oxide layer 205, a gate electrode 210, a hard mask layer 215 and a sidewall spacer 220, a source 230*a* and a drain 230*b*, which are formed at both sides of the semiconductor substrate 200.

After forming a bottom electrode 250 such that the bottom electrode 250 is electrically connected to the source 230*a* of the MOS transistor, a bulb-type bottom electrode contact 260 can be interposed between a bottom electrode 250 and a phase-change layer 265.

Reference numerals 235 and 255 represent interlayer dielectric layers and reference numeral 245 is a contact for connecting the source 230*a* to the bottom electrode 250.

While certain embodiments have been described above, it will be understood that the embodiments described are by way of example only. Accordingly, the systems and methods described herein should not be limited based on the described embodiments. Rather, the systems and methods described herein should only be limited in light of the claims that follow when taken in conjunction with the above description and accompanying drawings.

What is claimed is:

1. A method of manufacturing a phase-change memory device, the method comprising:
   forming a switching device in a semiconductor substrate;
   forming an interlayer dielectric layer on the semiconductor substrate;
   forming a bottom electrode contact hole in the interlayer dielectric layer, wherein a lower portion of the bottom electrode contact has a diameter larger than a diameter of an upper portion of the bottom electrode contact;
   forming a bottom electrode contact in the bottom electrode contact hole; and
   forming a phase-change layer on the interlayer dielectric layer,
   wherein forming the bottom electrode contact hole includes:
   forming a buffer layer on the interlayer dielectric layer;
   forming a preliminary hole by etching the buffer layer until a predetermined portion of the interlayer dielectric layer, over the switching device, is exposed;
   forming a blocking layer both on the buffer layer and on a surface of the preliminary hole;
   removing the blocking layer such that the predetermined portion of the interlayer dielectric layer, over the switching device, is exposed; and
   isotropically etching the exposed interlayer dielectric layer by using a remaining blocking layer as an etching mask.

2. The method of claim 1, wherein forming the buffer layer includes forming a layer having etching selectivity relative to the interlayer dielectric layer.

3. The method of claim 1, wherein forming the buffer layer includes:
   forming a first material layer, which has etching selectivity relative to the interlayer dielectric layer, on the interlayer dielectric layer; and
   forming a second material layer serving as a hard mask on the first material layer.

4. The method of claim 3, wherein forming the preliminary layer includes etching the buffer layer at a pressure of 10 to 30 mTorr, at a source power of 1000 to 2000 W, and at a bias power of 500 to 1000 W while providing CH2F2 gas, CHF4 gas, O2 gas, and Ar gas at flow rates of 5 to 15 sccm, 50 to 70 sccm, 5 to 15 sccm and 50 to 100 sccm, respectively.

5. The method of claim 1, wherein forming the blocking layer includes forming a layer having etching selectivity relative to the buffer layer.

6. The method of claim 5, wherein the blocking layer includes a silicon oxide layer.

7. The method of claim 1, wherein removing the blocking layer includes etching the blocking layer by setting the interlayer dielectric layer as an etching end point.

8. The method of claim 1, wherein the interlayer dielectric layer is isotropically etched at a pressure of 40 to 60 mTorr, at a source power of 500 to 1500 W, and at a bias power of 100 to 300 W while providing C4F6 gas, CHF3 gas, O2 gas, and Ar gas at flow rates of 10 to 30 sccm, 10 to 30 sccm, 5 to 20 sccm and 300 to 500 sccm, respectively.

9. The method of claim 1, wherein the isotropic etching of the interlayer dielectric layer includes wet-etching the interlayer dielectric layer.

10. The method of claim 1, further comprising:
    removing a remaining blocking layer; and
    removing the buffer layer, after isotropically etching the interlayer dielectric layer.

11. The method of claim 1, wherein forming the bottom electrode contact includes:
    forming a barrier metal layer on a surface of the bottom electrode contact hole; and
    forming a conductive layer on the barrier metal layer such that the bottom electrode contact hole is filled up with the conductive layer.

* * * * *